US012665608B2

(12) United States Patent
Wiesbauer et al.

(10) Patent No.: US 12,665,608 B2
(45) Date of Patent: Jun. 23, 2026

(54) HIGH INPUT IMPEDANCE LOW POWER ADC

(71) Applicant: Infineon Technologies AG, Neubiberg (DE)

(72) Inventors: Andreas Wiesbauer, Pörtschach (AT); Jose Luis Ceballos, Villach (AT); Luis Hernandez-Corporales, Madrid (ES)

(73) Assignee: Infineon Technologies AG, Neubiberg (DE)

( * ) Notice: Subject to any disclaimer, the term of this patent is extended or adjusted under 35 U.S.C. 154(b) by 105 days.

(21) Appl. No.: 18/674,266

(22) Filed: May 24, 2024

(65) Prior Publication Data

US 2025/0365000 A1 Nov. 27, 2025

(51) Int. Cl.
*H03M 1/08* (2006.01)

(52) U.S. Cl.
CPC ..................................... *H03M 1/08* (2013.01)

(58) Field of Classification Search
CPC ...................................................... H03M 1/08
See application file for complete search history.

(56) References Cited

U.S. PATENT DOCUMENTS

| | | | | | |
|---|---|---|---|---|---|
| 11,843,889 B2 * | 12/2023 | Young | ..................... | H04N 25/78 |
| 12,224,761 B2 * | 2/2025 | Gopinath | ............ | H03M 1/0626 |

| | | | | | |
|---|---|---|---|---|---|
| 2005/0275576 A1 * | 12/2005 | Fudge | ................. | H03M 1/0626 |
| | | | | | 341/155 |
| 2006/0176040 A1 * | 8/2006 | Kernahan | ............. | G06F 1/3203 |
| | | | | | 323/299 |
| 2013/0271307 A1 * | 10/2013 | Kropfitsch | ............. | H03G 3/002 |
| | | | | | 341/158 |
| 2015/0008308 A1 * | 1/2015 | Huang | ..................... | H03M 1/14 |
| | | | | | 341/156 |
| 2017/0154715 A1 * | 6/2017 | Li | ............................. | H03M 1/12 |
| 2019/0363730 A1 * | 11/2019 | Erol | ..................... | H03M 1/0665 |
| 2022/0368340 A1 * | 11/2022 | Kinyua | .................. | H03M 3/368 |
| 2022/0399859 A1 * | 12/2022 | Cooney | ................... | H03F 3/195 |
| 2023/0040581 A1 * | 2/2023 | Kwon | ................. | H03F 3/45475 |
| 2023/0412273 A1 * | 12/2023 | Dominguez-Gonzalez | .................. | |
| | | | | | H04B 10/116 |
| 2024/0097694 A1 * | 3/2024 | Sedighi | ................. | H03M 1/466 |
| 2024/0275345 A1 * | 8/2024 | Wang | .................. | H03F 3/45183 |
| 2025/0323608 A1 * | 10/2025 | Ceballos | ............... | H03F 1/3211 |

* cited by examiner

*Primary Examiner* — Lam T Mai
(74) *Attorney, Agent, or Firm* — Slater Matsil, LLP

(57) ABSTRACT

An electronic system is disclosed. The electronic system includes an input transistor having a source configured to receive an analog input signal; a filter having an input coupled to an output node of the input transistor; an ADC having an input coupled to an output of the filter and an output configured to provide a digital signal representative of the analog input signal; and a DAC having an input coupled to the output of the ADC and an output configured to provide a current to the source of the input transistor.

20 Claims, 8 Drawing Sheets

600

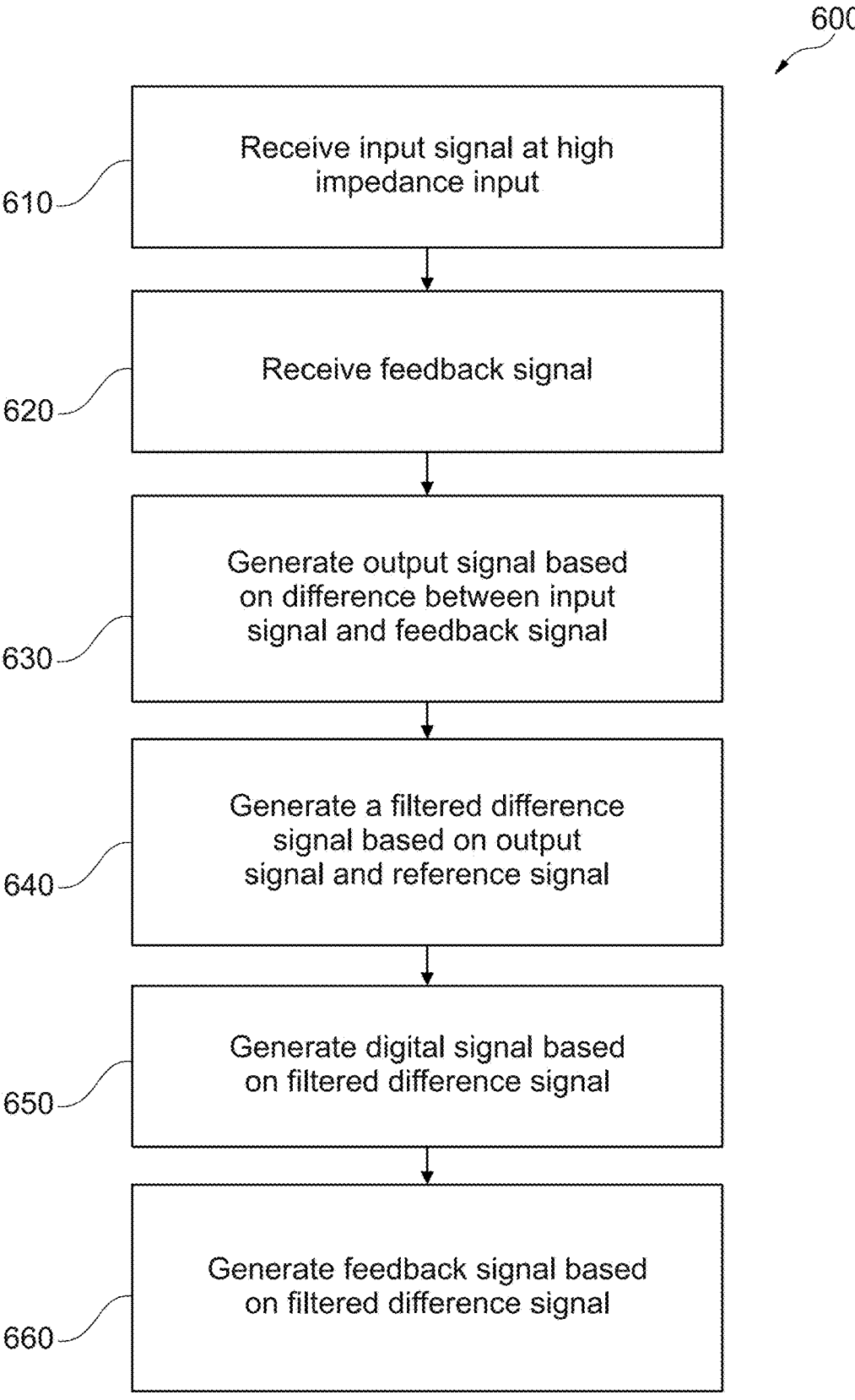

610 — Receive input signal at high impedance input

620 — Receive feedback signal

630 — Generate output signal based on difference between input signal and feedback signal 640 — Generate a filtered difference signal based on output signal and reference signal 650 — Generate digital signal based on filtered difference signal 660 — Generate feedback signal based on filtered difference signal

Fig. 6

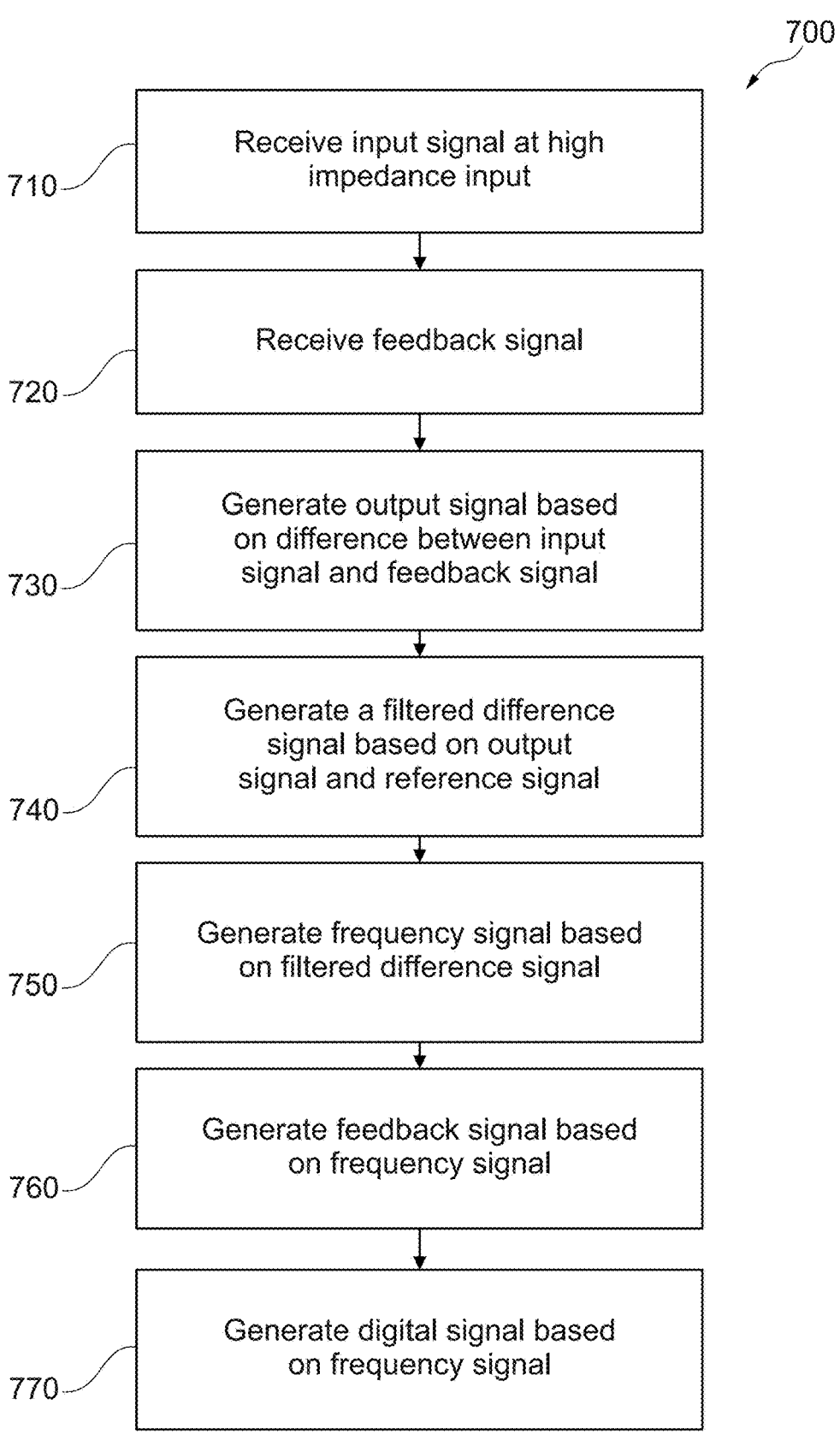

700

710 — Receive input signal at high impedance input

720 — Receive feedback signal

730 — Generate output signal based on difference between input signal and feedback signal 740 — Generate a filtered difference signal based on output signal and reference signal 750 — Generate frequency signal based on filtered difference signal 760 — Generate feedback signal based on frequency signal 770 — Generate digital signal based on frequency signal

Fig. 7

HIGH INPUT IMPEDANCE LOW POWER ADC

TECHNICAL FIELD

The present invention relates generally to circuits which use an ADC, and, in particular embodiments, to circuits which use an analog-to-digital converter (ADC) which receives a buffered input signal.

BACKGROUND

Digital microphones generally include a microelectromechanical system (MEMS) device that is responsive to ambient sound waves, a programmable gain amplifier (PGA) for amplifying an analog signal generated by the MEMS device, an analog-to-digital converter (ADC) for converting the analog signal into a digital signal, and digital signal processing circuitry to provide a digital output signal that corresponds to the input analog signal in a format requested by a customer. Typically, the MEMS device provides a signal to a buffering circuit to reduce the load, and the buffering circuit provides a buffered signal to the ADC.

SUMMARY

Another embodiment is an electronic system, including an input transistor having a source configured to receive an analog input signal; a filter having an input coupled to an output node of the input transistor; an ADC having an input coupled to an output of the filter and an output configured to provide a digital signal representative of the analog input signal; and a DAC having an input coupled to the output of the ADC and an output configured to provide a current to the source of the input transistor.

Another embodiment is an electronic system, including an input transistor having a gate configured to receive an analog input signal; a filter having an input coupled to an output node of the input transistor; an oscillator having a frequency control input coupled to an output of the filter; and a frequency to current converter having an input coupled to an output of the oscillator and an output configured to provide a current to a source of the input transistor.

Another embodiment is a method of using an electronic system, the method including with a source follower circuit, generating an output signal based on a difference between an input signal and a feedback signal, where the source follower circuit has a gain greater than one; generating a filtered difference signal based on the output signal and a reference signal; and generating a digital signal based on the filtered difference signal, where the digital signal corresponds with the input signal.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 is a flowchart of a method according to some embodiments; and

FIG. 7 is a block diagram of a digital microphone product, according to some embodiments.

DETAILED DESCRIPTION OF ILLUSTRATIVE EMBODIMENTS

Illustrative embodiments of the system and method of the present disclosure are described below. In the interest of clarity, all features of an actual implementation may not be described in this specification. It will of course be appreciated that in the development of any such actual embodiment, numerous implementation-specific decisions may be made to achieve the developer's specific goals, such as compliance with system-related and business-related constraints, which will vary from one implementation to another. Moreover, it should be appreciated that such a development effort might be complex and time-consuming but would nevertheless be a routine undertaking for those of ordinary skill in the art having the benefit of this disclosure.

In some embodiments, combined buffering and analog to digital conversion is beneficial for the new families of Silicon Microphones.

An ASIC for a digital MEMS microphone may use an architecture which has a separate buffer and ADC. A MEMS (such as a microphone transducer) generates signals for a high input impedance buffer, such as a source follower, which serves as an impedance conversion circuit, such that the MEMS can be operated, for example, in a constant charge mode, for example, for better linear operation. The buffer generates an analog signal output proportional to the MEMS displacement. The buffer drives an ADC, which converts the analog signal into a digital signal. In some embodiments, the ADC may be a noise shaping ADC, such as a Sigma Delta ADC.

In some embodiments, a buffer is integrated within a noise shaping ADC or within a noise shaping loop having a loop filter and voltage or current controlled oscillator. The buffer may include an input transistor having a control node (such as a gate or base) connected to the input node of the system, and an output node (such as a drain or collector) connected to the forward signal path of the noise shaping loop. Feedback is provided via a current to a reference node of the transistor (such as a source or emitter) based on an output of the ADC or a frequency of the voltage or current controlled oscillator.

Integrating a buffer having a gain of greater than 0 dB advantageously reduces the noise requirement of components within the noise shaping loop, such as the loop filter. These reduced noise requirements advantageously allows for lower power operation.

Figure 2:
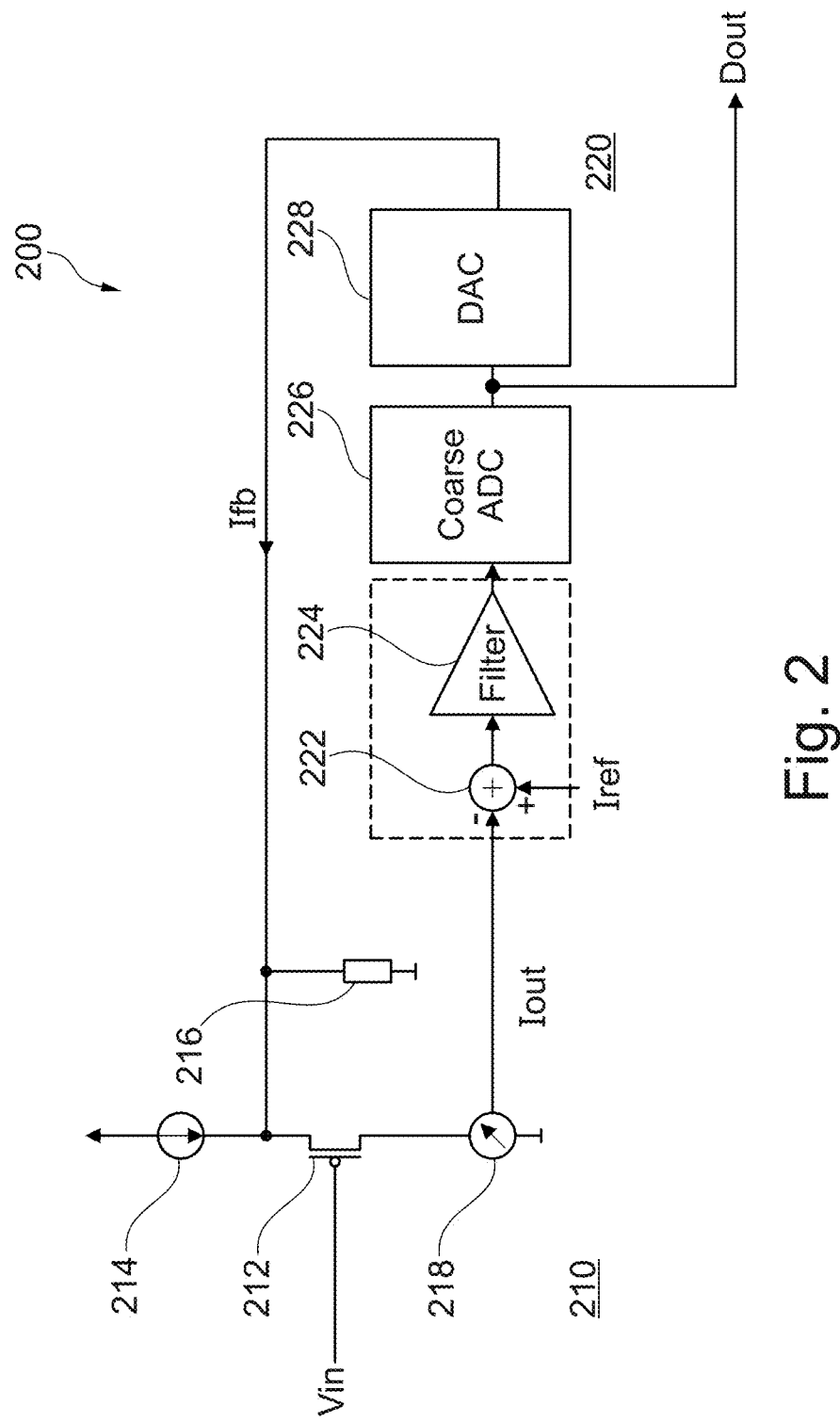
FIG. 2 is a block diagram of an exemplary conversion system comprising an analog-to-digital converter (ADC) and a buffered input according to some embodiments.

The ADC as shown in FIG. 2, may be used, for example, to improve the power efficiency of the ASIC. The architecture may have any one or more of the following features: The ADC loop keeps the buffer (e.g. source follower) current constant; Some or all or substantially all dynamic current is supplied by the DAC; and the DAC code corresponds with the input voltage.

Current saving may be achieved by reducing the noise requirements of the loop filter.

In some embodiments, the loop filter input receives an amplified signal. As a result, the loop filter can be implemented with a low supply current.

In some embodiments, the amplified signal is generated as part of the current sensing without extra current.

Figure 1:
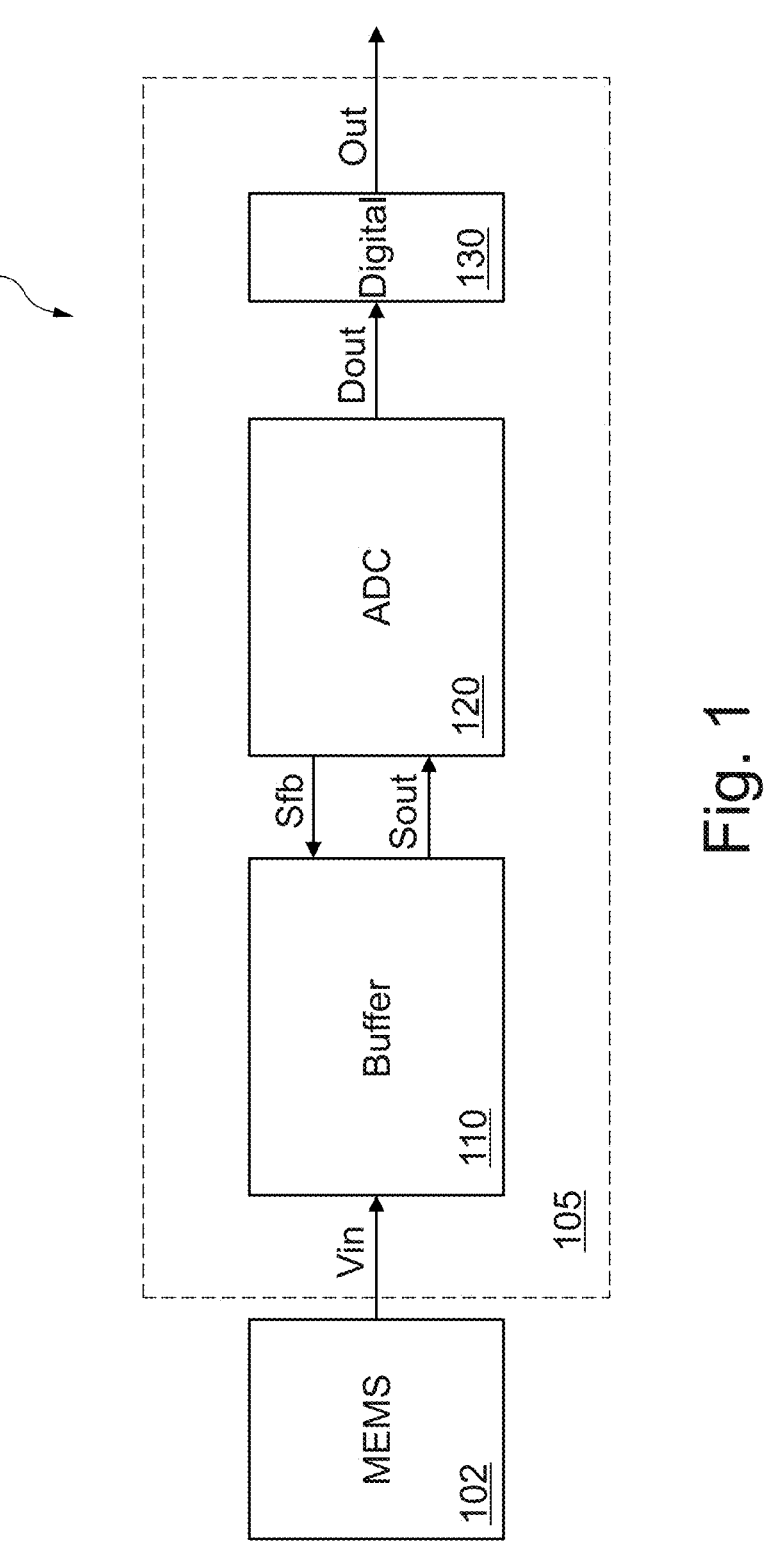
FIG. 1 is a block diagram of an exemplary electronic system comprising a MEMS device, a buffer circuit, and an analog-to-digital converter (ADC) according to some embodiments.

FIG. 1 is a block diagram of an electronic system 100 comprising a MEMS device 102 and a conversion system 105 including a buffer circuit 110, an analog-to-digital converter (ADC) 120, and a digital processor 130 according to some embodiments.

MEMS device 102 may be configured to generate a signal for conversion system 105. For example, in some embodiments, MEMS device 102 may include a transducer configured to generate a signal in response to an environmental stimulus. In some embodiments, MEMS device 102 includes a microphone.

In the illustrated embodiment, conversion system 105 receives a voltage input signal from MEMS device 102 in generates a digital output signal at node or nodes Dout. Accordingly, in the illustrated embodiment, conversion system 105 forms an analog to digital converter configured to generate digital signals corresponding with the analog voltage input signal from MEMS device 102. In alternative embodiments, conversion system 105 includes a different type of converter.

In the illustrated embodiment, conversion system 105 includes buffer circuit 110 and ADC 120.

Buffer circuit 110 is configured to receive the analog voltage input signal at node or nodes Vin generated by MEMS device 102, and is configured to receive a feedback signal at node or nodes Sfb from ADC 120. In addition, based on the analog voltage input signal and the feedback signal, buffer circuit 110 is configured to generate an output signal for ADC 120 at node or nodes Sout.

ADC 120 is configured to receive the output signal from buffer circuit 110 and to generate a digital output signal at node or nodes Dout based on the output signal. In addition, ADC 120 is configured to generate the feedback signal based on the output signal from buffer circuit 110.

In some embodiments, the feedback signal corresponds with the digital output signal. For example, in some embodiments, the feedback signal includes a current having a value corresponding with the digital output signal. In some embodiments, the feedback signal is generated based on the digital output signal. In some embodiments, the feedback signal is generated based on another signal, and the digital output signal is generated based on the other signal.

In some embodiments, the output signal generated by buffer circuit 110 corresponds with a difference between the feedback signal and the analog input signal. In some embodiments, buffer circuit 110 and ADC 120 collectively form a Sigma Delta converter or form part of a Sigma Delta converter.

Digital processor 130 is configured to receive the digital output signal from ADC 120, and to generate a digital signal corresponding with the analog voltage input from MEMS device 102.

In various embodiments, some or all of the components of electronic system 100 may be implemented on a single monolithic semiconductor integrated circuit, such as a single semiconductor substrate and/or a silicon substrate. In some embodiments, MEMS 102 may be implemented on a separate IC from conversion system 105. These components may be fabricated using one of a variety of different semiconductor processes, such as a CMOS, FinFET, Bipolar, BiCMOS, SOI, or other type of semiconductor process. MEMS 102 may be implemented using MEMS fabrication techniques known in the art.

FIG. 2 is a block diagram of conversion system 200 comprising an analog-to-digital converter (ADC) 220 and a buffered input stage 210 according to some embodiments. Conversion system 200 may be used as conversion system 105 of electronic system 100 illustrated in FIG. 1.

Buffered input stage 210 includes high input impedance source follower transistor 212, current source 214, load resistor 216, and current sense device 218.

Source follower transistor 212 receives the input voltage at its gate, and conducts current according to the voltage difference between its gate and its source. The amount of current conducted by source follower transistor 212 is equal to the current from current source 214 plus the feedback current Ifb from ADC 220 minus the current sunk by load resistor 216. Accordingly, the amount of current conducted by source follower transistor 212 provides an indication as to whether the feedback current Ifb is less than, equal to, or greater than the current sunk by load resistor 216. In some embodiments, the indication is or includes the difference between the current conducted by source follower transistor 212 and the current sourced by current source 214.

As shown, source follower transistor 212 is implemented as a PMOS transistor. However, in alternative embodiments, other transistor types could be used including, but limited to NMOS, another type of FET (such as JFET), or bipolar (npn or pnp). In such alternative embodiments, the surrounding circuitry would be adapted to accommodate the different device technologies using circuit design techniques known in the art.

Current sense device 218 senses the current conducted by source follower transistor 212. In addition, current sense device 218 generates a current Iout corresponding with the difference between the current conducted by source follower transistor 212 and the current sourced by current source 214, and includes an offset current value equal to reference current Iref.

In the illustrated embodiment, ADC 220 includes current difference circuit 222, filter 224, coarse ADC 226, and digital to analog converter (DAC) 228.

Current difference circuit 222 receives the current Iout from current sense device 218 and a reference current Iref. In addition, current difference circuit 222 generates a current difference signal for coarse ADC 226 based on a difference between the reference current Iref and the current Iout. The current difference signal is filtered by filter 224, which may have any suitable filter architecture. For example, in some embodiments, filter 224 includes one or more RC filters. In some embodiments, the resistance of the RC filter includes a passive resistor. In some embodiments, the resistance of the RC filter includes a transistor. In some embodiments, the resistance of the RC filter includes a switching transistor. In some embodiments, filter 224 includes the functionality of current difference circuit 222. Filter 224 generates an analog signal for coarse ADC 226.

Coarse ADC 226 digitizes the analog signal from filter 224 and generates a digital output signal at output Dout. Coarse ADC 226 may have any suitable analog-to-digital converter architecture. For example, course ADC 226 may have a successive approximation architecture, a flash architecture, a dual slope architecture, or another architecture.

DAC 228 receives the digital output signal generated by coarse ADC 226, and generates the feedback current Ifb based on the digital output signal. Accordingly, the feedback current Ifb has a value corresponding with the difference between the reference current Iref and the current Iout from current sense device 218, as quantized by coarse ADC 226. In some embodiments, the feedback current Ifb as a value corresponding with the difference between the current conducted by source follower transistor 212 and the current sourced by current source 214.

Figure 3:
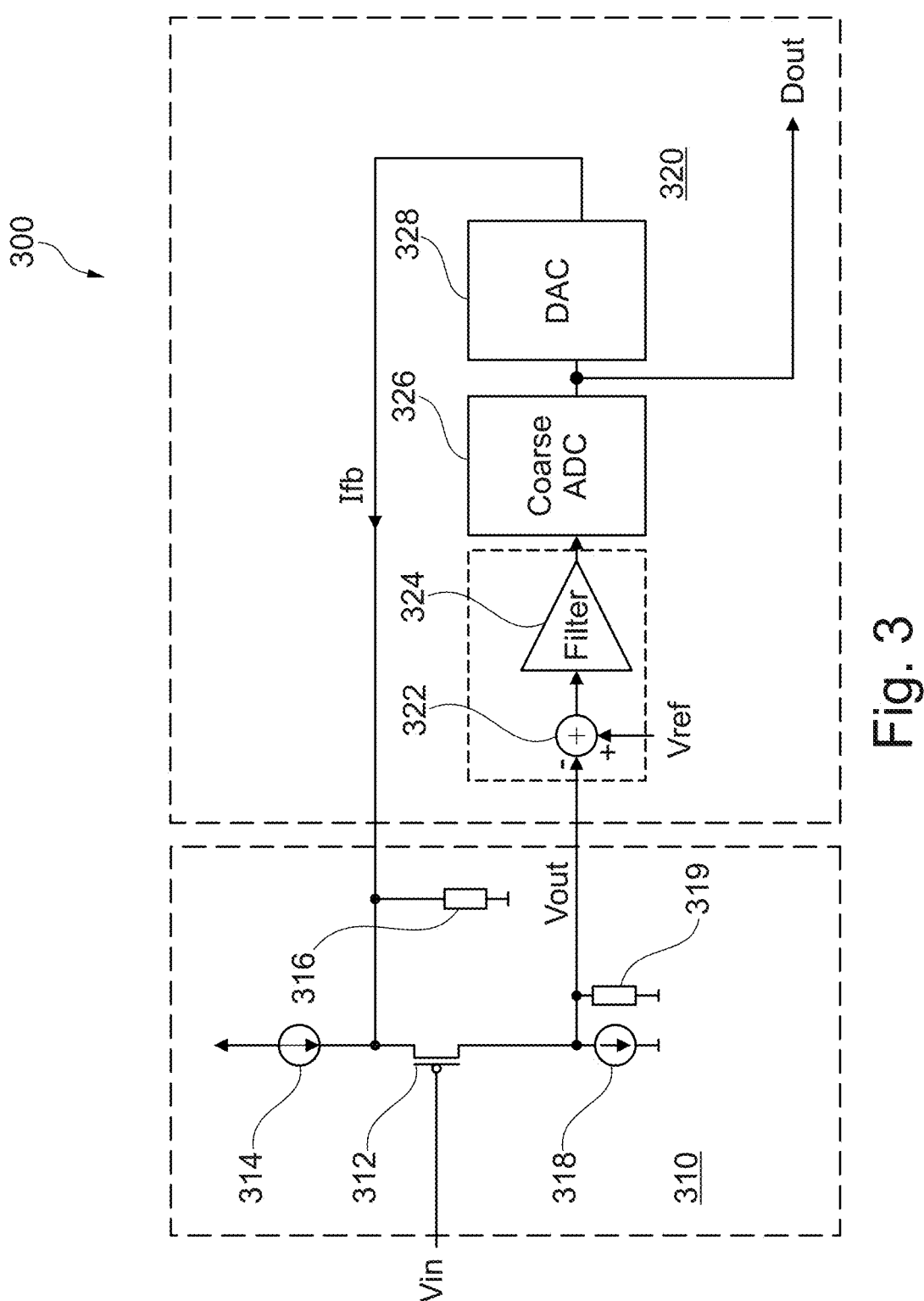
FIG. 3 is a block diagram of an exemplary conversion system comprising an analog-to-digital converter (ADC) and a buffered input according to some embodiments.

FIG. 3 is a block diagram of a conversion system 300 comprising an analog-to-digital converter (ADC) 320 and a buffered input stage 310 according to some embodiments. Conversion system 300 may be used as conversion system 105 of electronic system 100 illustrated in FIG. 1.

Buffered input stage 310 includes high input impedance source follower transistor 312, current source 314, load resistor 316, current source 318, and bias resistor 319.

Source follower transistor 312 receives the input voltage at its gate, and conducts current according to the voltage difference between its gate and its source. The amount of current conducted by source follower transistor 312 is equal to the current from current source 314 plus the feedback current Ifb from ADC 320 minus the current sunk by load resistor 316. Accordingly, the amount of current conducted by source follower transistor 312 provides an indication as to whether the feedback current Ifb is less than, equal to, or greater than the current sunk by load resistor 316. In some embodiments, the indication is or includes the difference between the current conducted by source follower transistor 312 and the current sourced by current source 314.

Current source 318 sinks a current to the negative power supply or ground.

Bias resistor 319 sinks a current equal to the difference between the current conducted by source follower transistor 312 and the current sunk by current source 318. Accordingly, the voltage Vout is equal to the resistance of bias resistor 319 times the difference between the current conducted by source follower transistor 312 and the current sunk by current source 318. In some embodiments, bias resistor 319 is partly or wholly a parasitic resistance of current source 318.

In some embodiments, a voltage Vout/Vin gain is greater than 0 dB. In some embodiments, the gain is greater than any of 3 dB, 6 dB, 10 dB, 12 dB, 15 dB, and 20 dB. Accordingly, because the buffered input stage 310 has a significant gain, the gain requirements for the other gain components, for example, of the ADC 320 are relaxed for a particular loop gain design goal or specification. Accordingly, the power consumption of the system is reduced.

In the illustrated embodiment, ADC 320 includes voltage difference circuit 322, filter 324, coarse ADC circuit 326, and digital to analog converter (DAC) 328.

Voltage difference circuit 322 receives the voltage Vout from buffered input stage 310 and a reference voltage Vref. In addition, voltage difference circuit 322 generates a voltage difference signal for coarse ADC circuit 326 based on a difference between the reference voltage Vref and the voltage Vout. The voltage difference signal is filtered by filter 324, which may have any suitable filter architecture. For example, in some embodiments, filter 324 includes one or more RC filters. In some embodiments, the resistance of the RC filter includes a passive resistor. In some embodiments, the resistance of the RC filter includes a transistor. In some embodiments, the resistance of the RC filter includes a switching transistor. In some embodiments, filter 324 includes the functionality of voltage difference circuit 322. Filter 324 generates an analog signal for coarse ADC 326.

Coarse ADC 326 digitizes the analog signal from filter 324 and generates a digital output signal at output Dout. Coarse ADC 326 may have any suitable analog-to-digital converter architecture. For example, course ADC 326 may have a successive approximation architecture, a flash architecture, a dual slope architecture, or another architecture.

DAC 328 receives the digital output signal generated by coarse ADC 326, and generates the feedback current Ifb based on the digital output signal. Accordingly, in some embodiments, the feedback current Ifb has a value corresponding with the difference between the reference voltage Vref and the voltage Vout from buffered input stage 310, as quantized by coarse ADC 326. In some embodiments, the feedback current Ifb as a value corresponding with the difference between the current conducted by source follower transistor 312 and the current sourced by current source 314.

Figure 4:
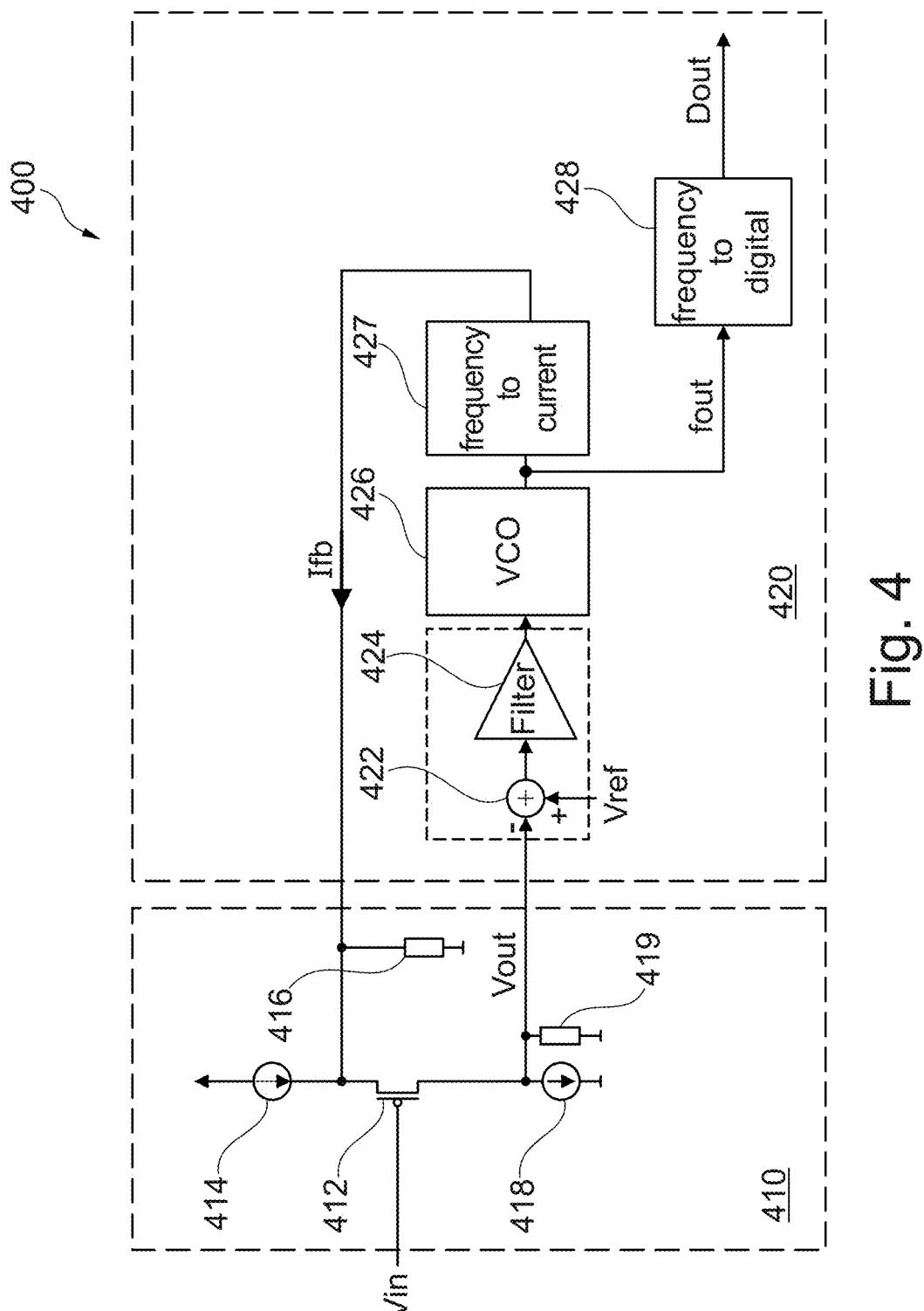
FIG. 4 is a block diagram of an exemplary conversion system comprising an analog-to-digital converter (ADC) and a buffered input according to some embodiments.

FIG. 4 is a block diagram of an exemplary conversion system 400 comprising an analog-to-digital converter (ADC) 420 and a buffered input stage 410 according to some embodiments. Conversion system 400 may be used as conversion system 105 of electronic system 100 illustrated in FIG. 1.

Buffered input stage 410 includes high input impedance source follower transistor 412, current source 414, load resistor 416, current source 418, and bias resistor 419.

Source follower transistor 412 receives the input voltage at its gate, and conducts current according to the voltage difference between its gate and its source. The amount of current conducted by source follower transistor 412 is equal to the current from current source 414 plus the feedback current Ifb from ADC 420 minus the current sunk by load resistor 416. Accordingly, the amount of current conducted by source follower transistor 412 provides an indication as to whether the feedback current Ifb is less than, equal to, or greater than the current sunk by load resistor 416. In some embodiments, the indication is or includes the difference between the current conducted by source follower transistor 412 and the current sourced by current source 414.

Current source 418 sinks a current to the negative power supply or ground.

Bias resistor 419 sinks a current equal to the difference between the current conducted by source follower transistor 412 and the current sunk by current source 418. Accordingly, the voltage Vout is equal to the resistance of bias resistor 419 times the difference between the current conducted by source follower transistor 412 and the current sunk by current source 418. In some embodiments, bias resistor 419 is partly or wholly a parasitic resistance of current source 418.

In some embodiments, a voltage Vout/Vin gain is greater than 0 dB. In some embodiments, the gain is greater than any of 3 dB, 6 dB, 10 dB, 12 dB, 15 dB, and 20 dB. Accordingly, to achieve a particular loop gain design goal or specification, because the buffered input stage 410 has a significant gain, the gain requirements for the other gain components, for example, of the ADC 420 are relaxed. Accordingly, the power consumption of the system is reduced.

In the illustrated embodiment, ADC 420 includes voltage difference circuit 422, filter 424, voltage controlled oscillator (VCO) 426, frequency to current circuit 427, and frequency to digital converter 428.

Voltage difference circuit 422 receives the voltage Vout from buffered input stage 410 and a reference voltage Vref. In addition, voltage difference circuit 422 generates a voltage difference signal for VCO 426 based on a difference between the reference voltage Vref and the voltage Vout. The voltage difference signal is filtered by filter 424, which may have any suitable filter architecture. For example, in some embodiments, filter 424 includes one or more RC filters. In some embodiments, the resistance of the RC filter includes a passive resistor. In some embodiments, the resistance of the RC filter includes a transistor. In some embodiments, the resistance of the RC filter includes a switching transistor. In some embodiments, filter 424 includes the functionality of voltage difference circuit 422. Filter 424 generates an analog signal for VCO 426.

VCO 426 receives the analog signal from filter 424 and generates a frequency signal having a frequency corresponding with the received analog signal. VCO 426 may have any suitable VCO architecture. One example of such an architecture is described below with respect to VCO 526 illustrated in FIG. 5. Some VCO architectures are single ended, and others are differential. Any of a number of control arrangements may be used.

Frequency to digital converter 428 receives the frequency signal from VCO 426, and generates a digital output signal at output Dout based on the received frequency signal. Frequency to digital converter 428 may have any suitable frequency to digital architecture. For example, in some embodiments, frequency to digital converter 428 is based on one or more of counters, phase samplers, read only memory (ROM) encoding, and another architectural feature.

Frequency to current circuit 427 receives the frequency signal generated by VCO 426, and generates the feedback current Ifb based on the received frequency. Accordingly, in some embodiments, the feedback current Ifb has a value corresponding with the difference between the reference voltage Vref and the voltage Vout from buffered input stage 410. In some embodiments, the feedback current Ifb as a value corresponding with the difference between the current conducted by source follower transistor 412 and the current sourced by current source 414. Frequency to current circuit 427 may include any suitable frequency to current architecture. For example, in some embodiments, frequency to current circuit 427 comprises one or more switched capacitor elements. In some embodiments, frequency to current circuit 427 comprises a frequency dependent resistor, for example having a capacitor connected in series with a switch with its gate connected to the frequency signal.

Figure 5:
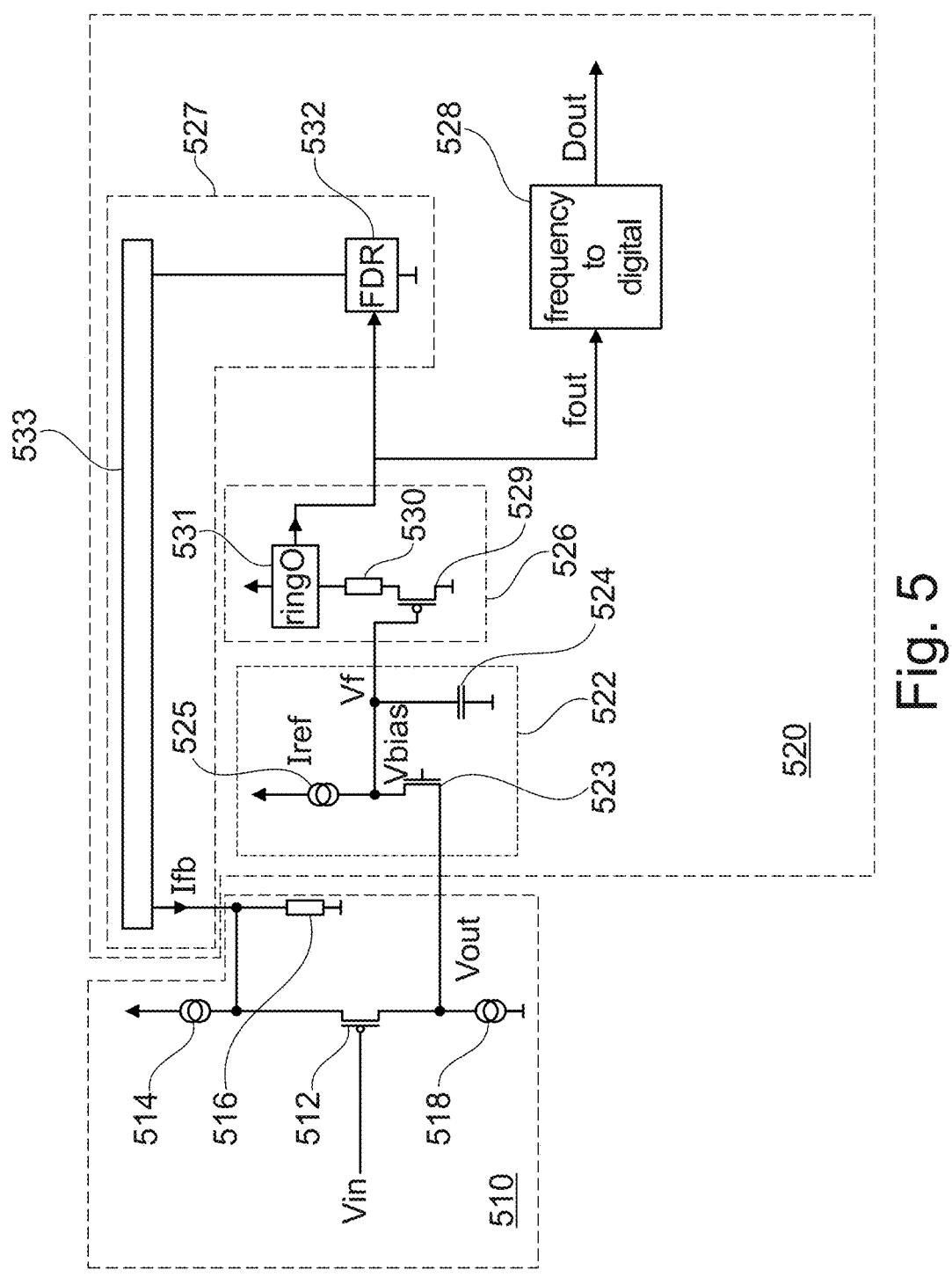
FIG. 5 is a block diagram of an exemplary conversion system comprising an analog-to-digital converter (ADC) and a buffered input according to some embodiments.

FIG. 5 is a block diagram of an exemplary conversion system 500 comprising an analog-to-digital converter (ADC) 520 and a buffered input stage 510 according to some embodiments. Conversion system 500 may be used as conversion system 105 of electronic system 100 illustrated in FIG. 1. In some embodiments, conversion system 500 may be an implementation of conversion system 400 of FIG. 4.

Buffered input stage 510 includes high input impedance source follower transistor 512, current source 514, load resistor 516, current source 518 having a parasitic bias resistor.

Source follower transistor 512 receives the input voltage at its gate, and conducts current according to the voltage difference between its gate and its source. The amount of current conducted by source follower transistor 512 is equal to the current from current source 514 plus the feedback current Ifb from ADC 520 minus the current sunk by load resistor 516. Accordingly, the amount of current conducted by source follower transistor 512 provides an indication as to whether the feedback current Ifb is less than, equal to, or greater than the current sunk by load resistor 516. In some embodiments, the indication is or includes the difference between the current conducted by source follower transistor 512 and the current sourced by current source 514.

Current source 518 sinks a current from source follower transistor 512 to the negative power supply or ground. Current source 518 also sinks current received from ADC 520.

In some embodiments, a voltage Vout/Vin gain is greater than 20 dB. Accordingly, because the buffered input stage 510 has a significant gain, the gain requirements for the other gain components, for example, of the ADC 520 are relaxed for a particular loop gain design goal or specification. Accordingly, the power consumption of the system is reduced.

In the illustrated embodiment, ADC 520 includes voltage difference/filter circuit 522, voltage controlled oscillator (VCO) 526, frequency to current circuit 527, and frequency to digital converter 528.

Voltage difference/filter circuit 522 includes bias transistor 523, current source 525, and capacitor 524.

Bias transistor 523 receives the bias voltage Vbias at its gate, and receives the voltage Vout at its source from buffered input stage 510. In addition, bias transistor 523 conducts a current to buffered input stage 510 based on the difference between the voltage Vbias and the voltage Vout.

Current source 525 sources a reference current Iref to either or both of bias transistor 523 and capacitor 524. In response to the voltage Vout being low enough, bias transistor 523 conducts a current to buffered input stage 510 which is greater than the reference current Iref. Consequently, bias transistor 523 conducts current from capacitor 524, and the voltage Vf is reduced. In response to the voltage Vout being high enough, bias transistor 523 conducts a current to buffered input stage 510 which is less than the reference current Iref. Consequently, current source 525 provides current to capacitor 524, and the voltage Vf increases. In response to the voltage Vout being a particular value, bias transistor 523 conducts a current to buffered input stage 510 which is equal to the reference current Iref. Consequently, bias transistor 523 does not conduct current from capacitor 524 and current source 525 does not provide current to capacitor 524, and the voltage Vf remains constant.

Accordingly, voltage difference/filter circuit 522 generates an analog voltage difference signal for VCO 526 based on a difference between the reference voltage Vbias and the voltage Vout. The voltage difference signal is filtered because of capacitor 524.

VCO 526 receives the analog signal from difference/filter circuit 522 and generates a frequency signal fout having a frequency corresponding with the received analog signal. VCO 526 includes transistor 529, resistor 530, and ring oscillator 531.

Transistor 529 receives the analog signal from difference/filter circuit 522, and in cooperation with resistor 530 provides a level shifted signal to ring oscillator 531. Ring oscillator 531 creates a frequency signal fout having a frequency corresponding with the level shifted signal.

Frequency to digital converter 528 receives the frequency signal fout from VCO 526, and generates a digital output signal at output Dout based on the received frequency signal fout. Frequency to digital converter 528 may have any suitable frequency to digital architecture. For example, in some embodiments, frequency to digital converter 528 is based on one or more of counters, phase samplers, read only memory (ROM) encoding, and another architectural feature.

Frequency to current circuit 527 includes frequency dependent resistor 532 and current mirror 533.

Frequency dependent resistor 532 receives the frequency signal fout generated by VCO 526, and presents a resistive load to current mirror 533 corresponding with the frequency of the frequency signal fout.

In addition, current mirror 533 generates the feedback current Ifb based on the current provided to frequency dependent resistor 532. Accordingly, the feedback current Ifb has a value corresponding with a filtered difference between the reference voltage Vbias and the voltage Vout from buffered input stage 510. In some embodiments, the feedback current Ifb as a value corresponding with the difference between the current conducted by source follower transistor 512 and the current sourced by current source 514. Frequency to current circuit 527 may include other suitable frequency to current architectures.

FIG. 6 is a flowchart of a method 600 according to some embodiments. Method 600 may be performed, for example by electronic system 100. In some embodiments, method 600 may be performed by a conversion system such as conversion system 105, conversion system 200, or conversion system 300. In some embodiments, two or more of the illustrated actions may be performed simultaneously, or in a sequential order different from that illustrated.

At 610, and input signal is received at a high impedance input. For example, a buffered input stage, such as buffered input stage 210 or buffered input stage 310 may receive the input signal at the gate of a transistor.

At 620, a feedback signal is received. For example, a buffered input stage, such as buffered input stage 210 or buffered input stage 310 may receive the feedback signal at a node connected to the transistor.

At 630, an output signal is generated based on a difference between the feedback signal and the input signal. For example, a buffered input stage, such as buffered input stage 210 or buffered input stage 310 may generate an output voltage or current signal based on a difference between the feedback signal and the input signal.

At 640, a filtered difference signal is generated based on a difference between a reference signal and the output signal generated at 630. For example, an ADC, such as ADC 220 or ADC 320 may use a filter circuit such as filter 224 or filter circuit 324 to filter a difference between a reference signal and the output signal generated at 630.

At 650, a digital signal is received based on the filtered difference signal. For example, an ADC, such as ADC 220 or ADC 320 may use a coarse ADC circuit such as coarse ADC 226 or coarse ADC 326 to generate the digital signal based on the filtered difference signal.

At 660, the feedback signal received at 620 is generated based on the filtered difference signal. For example, an ADC, such as ADC 220 or ADC 320 may use a DAC such as DAC 228 or DAC 328 to generate the feedback signal based on the filtered difference signal.

FIG. 7 is a flowchart of a method 700 according to some embodiments. Method 700 may be performed, for example by electronic system 100. In some embodiments, method 700 may be performed by a conversion system such as conversion system 105, conversion system 400, or conversion system 500.

At 710, and input signal is received at a high impedance input. For example, a buffered input stage, such as buffered input stage 410 or buffered input stage 510 may receive the input signal at the gate of a transistor.

At 720, a feedback signal is received. For example, a buffered input stage, such as buffered input stage 410 or buffered input stage 510 may receive the feedback signal at a node connected to the transistor.

At 730, an output signal is generated based on a difference between the feedback signal and the input signal. For example, a buffered input stage, such as buffered input stage 410 or buffered input stage 510 may generate an output voltage or current signal based on a difference between the feedback signal and the input signal.

At 740, a filtered difference signal is generated based on a difference between a reference signal and the output signal generated at 730. For example, an ADC, such as ADC 420 or ADC 520 may use a filter circuit such as filter circuit 424 or voltage difference/filter circuit 522 to filter a difference between a reference signal and the output signal generated at 730.

At 750, a frequency signal is generated based on the filtered difference signal. For example, an ADC, such as ADC 420 or ADC 520 may use a filter circuit such as filter circuit 424 or voltage difference/filter circuit 522 and a VCO circuit such as VCO 426 or VCO 526 to generate the frequency signal based on the filtered difference signal.

At 760, the feedback signal received at 720 is generated based on the frequency signal. For example, an ADC, such as ADC 420 or ADC 520 may use a frequency to current circuit such as frequency to current circuit 427 or frequency to current circuit 527 to generate the feedback signal based on the frequency signal.

At 770, a digital signal is generated based on the frequency signal. For example, an ADC, such as ADC 420 or ADC 520 may use a frequency to digital circuit such as frequency to digital circuit 428 or frequency to digital converter 528 to generate the digital signal based on the frequency signal.

Figure 8:
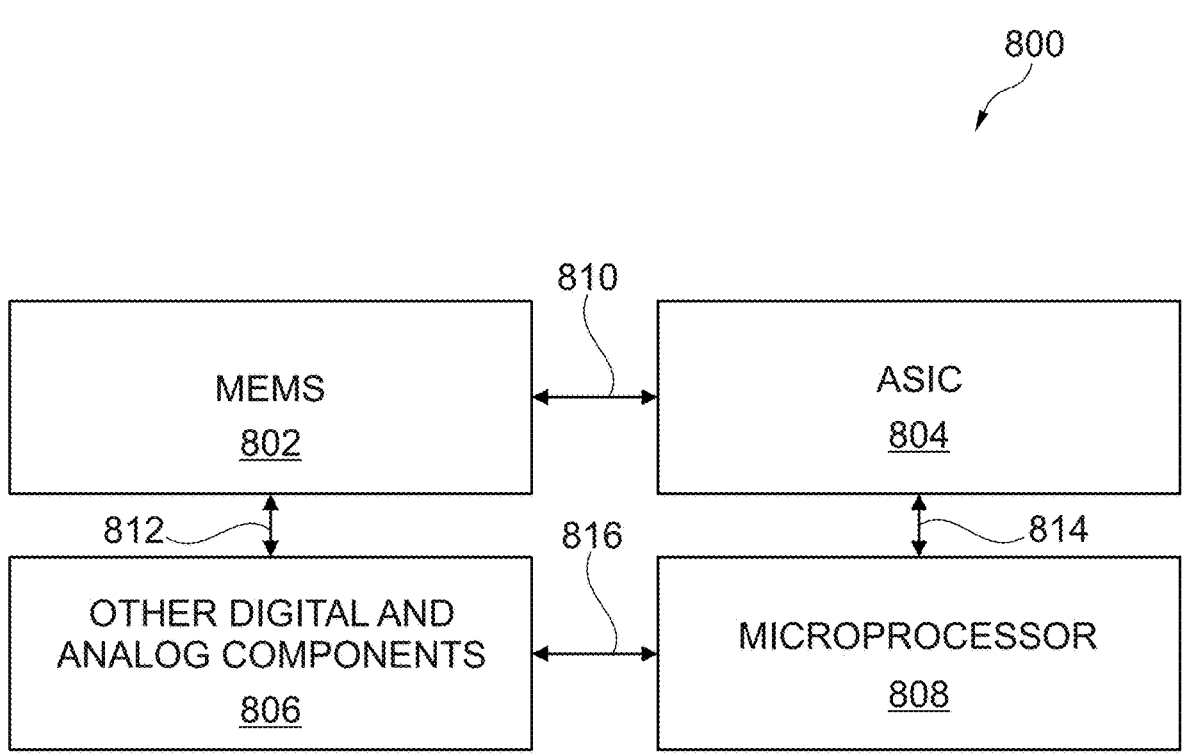
FIG. 8 is a block diagram of a digital microphone product according to some embodiments.

FIG. 8 is a block diagram for a digital microphone product 800 including a logarithmic amplifier system, for example, as described above. Digital microphone product 800 includes MEMS device 802 and ASIC 804. MEMS device 802 can comprise a capacitive MEMS device that generates an analog voltage in response to received sound waves. ASIC 804 can comprise the logarithmic amplifier system and an anti-logarithmic digital component, for example, as previously described. The MEMS device 802 and ASIC 804 are in communication via bidirectional bus 810. MEMS device 802 and ASIC 804 can be packaged together to form a single digital product, such as a digital microphone. In some embodiments, digital microphone product 800 can also include other digital and analog components 806, such as additional filters, amplifiers, and other similar components. The other digital and analog components 806 can communicate with MEMS device 802 through bidirectional bus 812. In some embodiments, digital microphone product 800 can also include a microprocessor 808, which can communicate with ASIC 804 and the other digital and analog components 806 through bidirectional bus 814 and bidirectional bus 816. For example, microprocessor 808 can generate clock signals and receive data from ASIC 804. In other embodiments, microprocessor 808 can provide the functionality of digital or software components that would otherwise be resident on ASIC 804.

Embodiments of the present invention are summarized here. Other embodiments can also be understood from the entirety of the specification and the claims filed herein.

One embodiment is an electronic system, including an input transistor having a source configured to receive an analog input signal; a filter having an input coupled to an output node of the input transistor; an ADC having an input coupled to an output of the filter and an output configured to provide a digital signal representative of the analog input signal; and a DAC having an input coupled to the output of the ADC and an output configured to provide a current to the source of the input transistor. In some embodiments, where the input transistor, the ADC, and the DAC form a noise shaping loop. In some embodiments, further including a first current source electrically connected to the source of the input transistor; and a second current source electrically connected to a drain of the input transistor. In some embodiments, further including a resistor connected to the source of the input transistor. In some embodiments, where a signal gain between a gate of the input transistor and an input to the filter is greater than 0 dB. In some embodiments, where the filter includes an input coupled to a reference current source. In some embodiments, where the filter includes an input coupled to a reference voltage source.

Another embodiment is an electronic system, including an input transistor having a gate configured to receive an analog input signal; a filter having an input coupled to an output node of the input transistor; an oscillator having a frequency control input coupled to an output of the filter; and a frequency to current converter having an input coupled to an output of the oscillator and an output configured to provide a current to a source of the input transistor. In some embodiments, further including a frequency to digital converter having an input coupled to the output of the oscillator and an output configured to provide a digital representation of the analog input signal. In some embodiments, where the input transistor, the filter, the oscillator, and the frequency to current converter form a noise shaping loop. In some embodiments, further including a first current source electrically connected to the source of the input transistor; and a second current source electrically connected to a drain of the input transistor. In some embodiments, where the filter includes an input coupled to a reference current source. In some embodiments, where the filter includes an input coupled to a reference voltage source. In some embodiments, further including a resistor connected to the source of the input transistor. In some embodiments, where a signal gain between the gate of the input transistor and an input to the filter is greater than 0 dB. In some embodiments, where the frequency to current converter includes a frequency dependent resistor.

Another embodiment is a method of using an electronic system, the method including with a source follower circuit, generating an output signal based on a difference between an input signal and a feedback signal, where the source follower circuit has a gain greater than one; generating a filtered difference signal based on the output signal and a reference signal; and generating a digital signal based on the filtered difference signal, where the digital signal corresponds with the input signal. In some embodiments, further including generating the feedback signal based on the filtered difference signal. In some embodiments, further including generating a frequency signal based on the filtered difference signal; and generating the digital signal based on the frequency signal. In some embodiments, further including generating a frequency signal based on the filtered difference signal; and generating the feedback signal based on the frequency signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electronic system, comprising:
an input transistor having a gate configured to receive an analog input signal;
a filter having an input coupled to an output node of the input transistor;
an ADC having an input coupled to an output of the filter and an output configured to provide a digital signal representative of the analog input signal; and
a DAC having an input coupled to the output of the ADC and an output configured to provide a current to a source of the input transistor.

2. The electronic system of claim 1, wherein the input transistor, the ADC, and the DAC form a noise shaping loop.

3. The electronic system of claim 2, further comprising:
a first current source electrically connected to the source of the input transistor; and
a second current source electrically connected to a drain of the input transistor.

4. The electronic system of claim 3, further comprising a resistor connected to the source of the input transistor.

5. The electronic system of claim 1, wherein a signal gain between the gate of the input transistor and an input to the filter is greater than 0 dB.

6. The electronic system of claim 1, wherein the filter comprises an input coupled to a reference current source.

7. The electronic system of claim 6, wherein the filter comprises an input coupled to a reference voltage source.

8. An electronic system, comprising:
an input transistor having a gate configured to receive an analog input signal;
a filter having an input coupled to an output node of the input transistor;
an oscillator having a frequency control input coupled to an output of the filter; and
a frequency to current converter having an input coupled to an output of the oscillator and an output configured to provide a current to a source of the input transistor.

9. The electronic system of claim 8, further comprising a frequency to digital converter having an input coupled to the output of the oscillator and an output configured to provide a digital representation of the analog input signal.

10. The electronic system of claim 9, wherein the input transistor, the filter, the oscillator, and the frequency to current converter form a noise shaping loop.

11. The electronic system of claim 8, further comprising:
a first current source electrically connected to the source of the input transistor; and
a second current source electrically connected to a drain of the input transistor.

12. The electronic system of claim 8, wherein the filter comprises an input coupled to a reference current source.

13. The electronic system of claim 8, wherein the filter comprises an input coupled to a reference voltage source.

14. The electronic system of claim 8, further comprising a resistor connected to the source of the input transistor.

15. The electronic system of claim 8, wherein a signal gain between the gate of the input transistor and an input to the filter is greater than 0 dB.

16. The electronic system of claim 8, wherein the frequency to current converter comprises a frequency dependent resistor.

17. A method of using an electronic system, the method comprising:

with a source follower circuit, generating an output signal based on a difference between an input signal and a feedback signal, wherein the source follower circuit has a gain greater than one;

generating a filtered difference signal based on the output signal and a reference signal; and generating a digital signal based on the filtered difference signal, wherein the digital signal corresponds with the input signal.

18. The method of claim 17, further comprising generating the feedback signal based on the filtered difference signal.

19. The method of claim 17, further comprising:

generating a frequency signal based on the filtered difference signal; and generating the digital signal based on the frequency signal.

20. The method of claim 17, further comprising:

generating a frequency signal based on the filtered difference signal; and generating the feedback signal based on the frequency signal.

* * * * *